United States Patent [19]

Erhage

[11] Patent Number: 5,576,665
[45] Date of Patent: Nov. 19, 1996

[54] METHOD AND DEVICE FOR PHASE-SHIFTING A PHASE LOCKED LOOP OUTPUT SIGNAL

[75] Inventor: Lars Erhage, Göteborg, Sweden

[73] Assignee: Telefonaktiebolaget LM Ericsson, Stockholm, Sweden

[21] Appl. No.: 497,049

[22] Filed: Jun. 30, 1995

[30] Foreign Application Priority Data

Jul. 6, 1994 [SE] Sweden .................... 9402384

[51] Int. Cl.⁶ .................... H03L 7/081; H03L 7/16
[52] U.S. Cl. .................... 331/14; 331/10; 331/16; 331/18; 331/25
[58] Field of Search .................... 331/14, 10, 16, 331/25, 18

[56] References Cited

U.S. PATENT DOCUMENTS

| 4,495,473 | 1/1985 | Treise | 331/10 |
| 4,546,328 | 10/1985 | Smith et al. | 331/25 |
| 4,668,923 | 5/1987 | Lofter | 331/16 |

FOREIGN PATENT DOCUMENTS

| 010077 | 4/1980 | European Pat. Off. . |
| 172425 | 2/1986 | European Pat. Off. . |
| 199686 | 10/1986 | European Pat. Off. . |
| 319851 | 6/1989 | European Pat. Off. . |

*Primary Examiner*—Siegfried H. Grimm
*Attorney, Agent, or Firm*—Burns, Doane, Swecker & Mathis, L.L.P.

[57] ABSTRACT

A method and a device for changing the phase of a generated signal by a predetermined value in a device for frequency generation. In the device for frequency generation, the generated signal is phase-locked to a reference signal where non-integer multiples of the frequency of the generated signal may be phase-locked to the reference signal by changing the phase of each of the periods of the reference signal by a value which determines the frequency of the generated signal. The phase is changed by a phase-shifter. The change of the phase of the generated signal is made by controlling the phase-shifter so that no change of the phase of the reference signal is made during at least one period of the reference signal.

7 Claims, 4 Drawing Sheets

METHOD AND DEVICE FOR PHASE-SHIFTING A PHASE LOCKED LOOP OUTPUT SIGNAL

BACKGROUND

The present invention relates to a method and a device for phase-shifting a signal that has been generated by an oscillator which is controlled by a reference oscillator via a phase locked loop.

Oscillator devices for generation of different frequencies often consist of a voltage controlled oscillator (VCO) whose output signal is locked by means of a phase locked loop to a reference signal. For attaining a good stability, among other things, the reference signal is generated by a high quality, mostly crystal controlled, voltage controlled oscillator (VCXO). Such oscillator devices have many uses, for example as local Oscillators for radio communication and radar equipment.

Normally, there is a wish to be able to generate different frequencies from the same oscillator device. It is relatively simple to lock the frequency of the voltage controlled oscillator to an integer multiple of the frequency of the reference signal by means of the phase locked loop. To only be able to generate integer multiples of the frequency of the reference signal is, however, a limitation that frequently cannot be accepted.

To make it possible to choose frequency more freely, frequency dividers have for example been introduced for both the reference signal as well as for the output signal of the controlled oscillator before it is compared in the phase locked loop. By choosing different divisors for the two signals, it is thereby possible to considerably increase the possibilities to choose frequency.

Another way to increase the flexibility of adjustment of the frequency is described in U.S. Pat. No. 4,668,923. According to the described device in the patent, a reference signal is periodically phase rotated before it is compared with the output signal of the controlled oscillator. By choosing different values of the size of the phase rotation, it is in principle possible to tune to any frequency that is higher than the reference signal.

The device according to the US patent thus provides good possibilities for frequency adjustment. In certain applications, it is however desirable to be able to also adjust the phase of the signal. This is however not possible with the device described in the U.S. patent and nor is it possible in the devices mentioned above where the frequency is set by a selection of different divisors.

SUMMARY

One object of the invention is thus to provide a method and an arrangement which rotates the phase of the output signal from an oscillator device of the type that is described in U.S. Pat. No. 4,668,923, i.e. a device in which the output signal, whose frequency can be a non-integer multiple of the reference signal, can be phase locked to a reference signal with the aid of a phase locked loop. By the invention, it is possible to attain a determined and well defined phase rotation of the signal.

Said object is achieved according to a method and an arrangement in which the periodically repeating phase change of the reference signal, that in the known device is a prerequisite for non-integer multiples of the output signal of the oscillator device to be able to phase lock to the reference signal, is inhibited during a certain time. By this measure, the times when the output signal is sampled before the comparison will be shifted, whereby an error signal will appear. The error signal controls the phase locked loop so that the phase of the output signal after a certain transient time assumes the new value. Since the change of the phase is decided by how many of the periodically repeating phase changes that are inhibited and to which multiple of the reference signal's frequency that the output signal is locked to, a high accuracy is attained.

In a preferred embodiment of the invention, the transient time can be reduced. This is attained by, in connection with the inhibition of the periodic phase changes, rotating the phase of the oscillator device's output signal by a predetermined value, principally coinciding with the desired phase shift. Thus, when sampling the output signal, virtually no error signal will appear which implies a quick and accurate setup of the new phase of the output signal.

DETAILED DESCRIPTION

Figure 1:
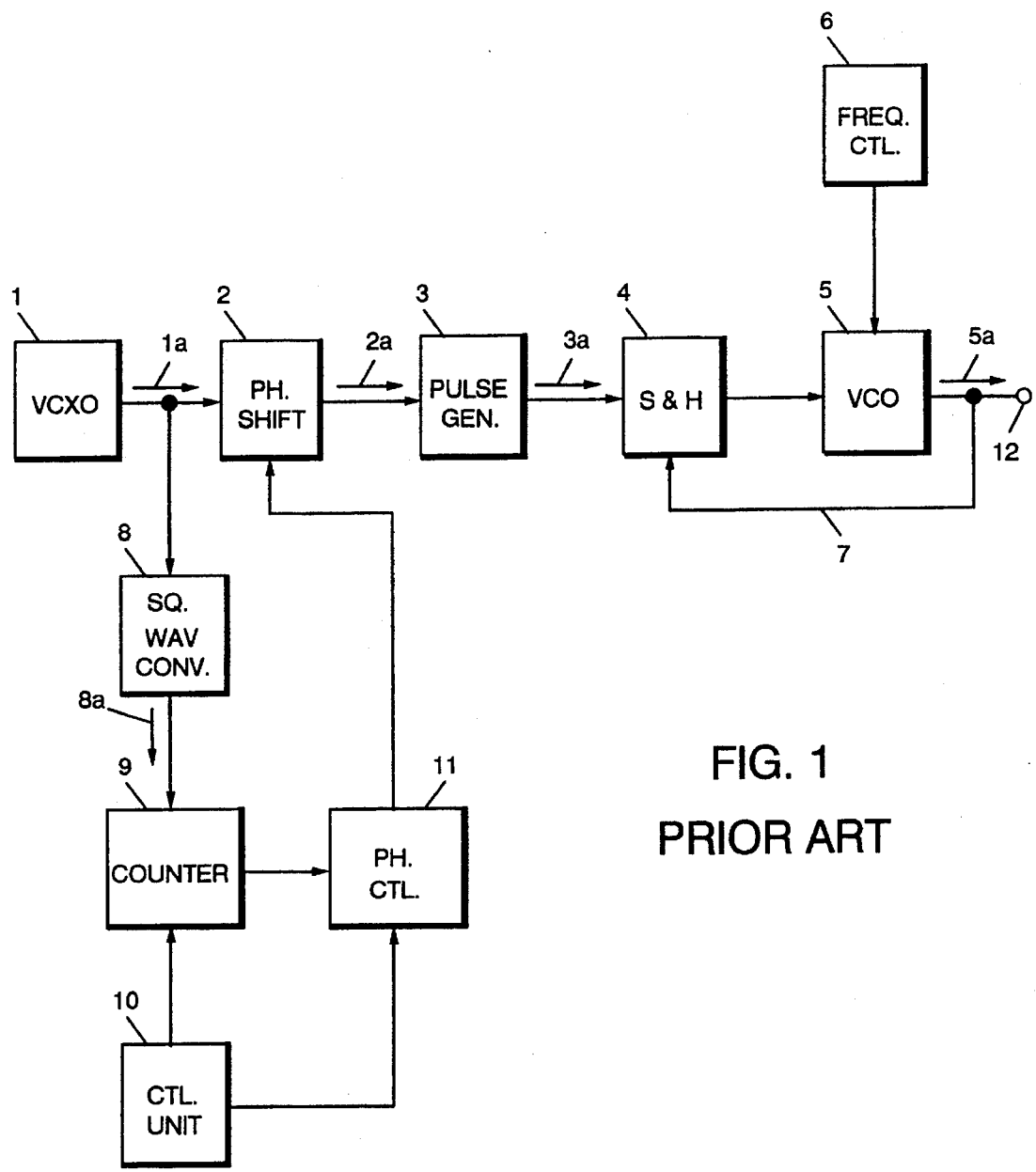
FIG. 1 shows a block diagram of a known device for frequency generations.

By way of introduction to facilitate the understanding of the invention, a known oscillator device for the generation of an arbitrary number of different frequencies will be described with reference to FIGS. 1 and 2.

The device comprises a reference oscillator 1 whose output signal 1a is connected to a pulse generating device 3 via a controllable first phase shifting device (phase shifter) 2. This device generates a pulse 3a every time the phase shifted reference oscillator signal 2a assumes a certain state. This state can, for example, be when the amplitude of the signal crosses the value zero when changing from a negative to a positive value.

The generated pulse determines the sampling time for a sample-and-hold circuit 4 to which the output signal 5a from a voltage controlled oscillator 5 (VCO) is also connected. The output signal is also connected to the output connection 12 of the device. The frequency of the voltage controlled oscillator is coarsely determined by a control signal from a frequency controlling device 6. This control signal can for example consist of a DC voltage or digital words that indicate the desired frequency.

If the phase shift of the first phase shifter 2 is initially assumed to be constant and equal to zero, the device described up to now will function in the following manner. From the pulse generating device 3, the pulses 3a will be generated with the same frequency as the reference oscillator signal and at points in time when this signal's amplitude is equal to zero. At these times, the output of the VCO will be sampled with the sample-and-hold circuit 4. If the sampling is performed when the output signal is not equal to zero, the hold circuit will yield an "error" signal. This error signal is made to influence the frequency of the VCO, whereby it is changed depending on the sign of the error signal. The frequency is thus changed so that the phase for some of the zero crossings of the output signal coincides with the sampling times, i.e. the value of the sampled signal is equal to zero. The loop formed by the sample-add-hold circuit 4, the VCO 5, and the feedback 7 will thus phase lock the output signal of the VCO to the output signal of the reference oscillator. The frequency of the output signal of the VCO will therefore be equal to the reference oscillator frequency or be an integer multiple of it.

By periodically changing the phase shift in the first phase shifter 2 from, for example, 0 the time between the sampling pulses will change. Due to this it becomes possible to phase lock the output signal of the VCO even if its frequency is not an integer multiple of the reference oscillator's frequency.

The control of the phase shifter 2 occurs in the shown example by means of the reference oscillator signal being converted in the signal conversion device 8 to a square wave signal 8a. The square wave signal is fed to a counter 9 that counts the negative edges of the square wave signal. The maximum value that the counter 9 can assume before it is reset to 0 is determined by a control unit 10. In the example according to FIG. 2, the highest value is preset so that the counter can only assume two different values.

The current value of the counter is transferred to a phase controlling device 11. A new value will thus be transferred to the phase controlling device 11 for every counted negative edge of the square wave signal.

The phase controlling device 11 is adapted in such a way that, when the value to the phase controlling device increases with 1, it controls the phase shifter 2 so that its phase shift increases with $\Delta\phi$. $\Delta\phi$ is chosen so that it corresponds to the phase difference of the output signal of the VCO that arises during a period of the reference signal and in relation to it because the frequency of the output signal of the VCO is not an integer multiple of the frequency of the reference signal. When the counter 9 reaches its highest value, the phase shift will thus be $(360°-\Delta\phi)/N$, where N is the ratio between the frequency of the output signal of the VCO and the frequency of the reference signal. Afterwards, the counter is reset and the phase shift becomes equal to 0 and a new counting cycle is started.

The adaptation of the phase controlling device 11 is done with the aid of the control unit 10.

Thus, by a combination of selection of "coarse frequency" with the aid of the frequency controlling device 6 and, via the control unit 10, the number to which the counter 9 should count and $\Delta\phi$, is possible to set the VCO to practically any arbitrary frequency.

In the described device, the phase shifter 2 has been placed between the reference oscillator 1 and the pulse generating device 3. Alternatively, the phase shifter can be placed in the feedback 7. In this embodiment, the time distance between the sampling pulses will be constant, and the phase for the output signal of the VCO that is fed back is instead changed. A man skilled in the art easily recognizes that this embodiment is equivalent to the one previously described.

According to the method that constitutes a part of the invention, it is possible to accurately change the phase for the signal generated by the device by a fixed and defined value. The method means that the counter 9 is inhibited at certain times so that one or more of the negative edges of the signal from the square wave generator 8 are not counted, whereby the counting cycle of the counter is extended. As the times for sampling are therefore shifted, an error signal appears that, via the phase locked loop, will control the output signal to a new phase. According to an advantageous supplement to the method, the error signal can however be compensated to a large extent by phase shifting the output signal from the voltage controlled oscillator with the desired phase shift value. Possible remaining phase shift errors will be corrected by the normal function of the phase locked loop. By means of the method, a very fast and accurate phase shift of the oscillator output signal is thus attained.

An example of an application of the method will now be described with reference to FIGS. 3 and 4. A plurality of the devices and signals appearing in these Figures are identical to those described earlier in FIGS. 1 and 2 and have in these cases been assigned the same reference numerals.

Figure 2:
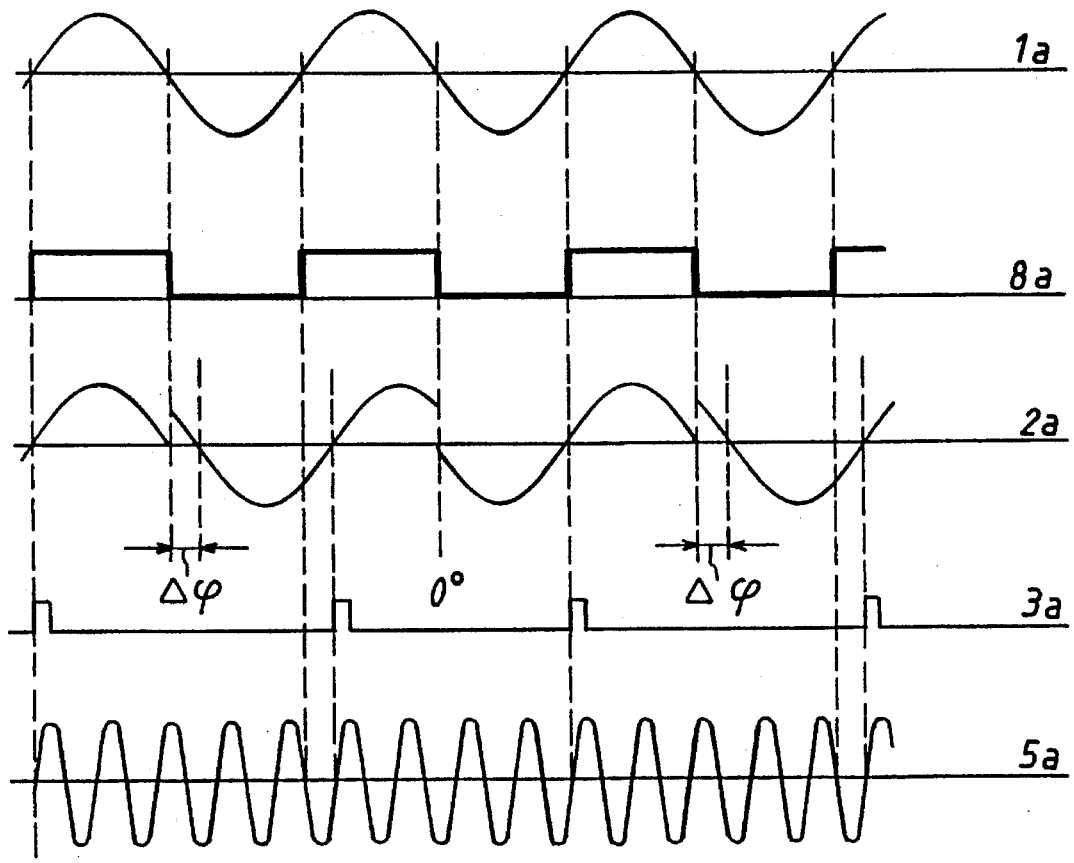
FIG. 2 shows appearances of certain signals in the known device in a time diagram.
Figure 3:
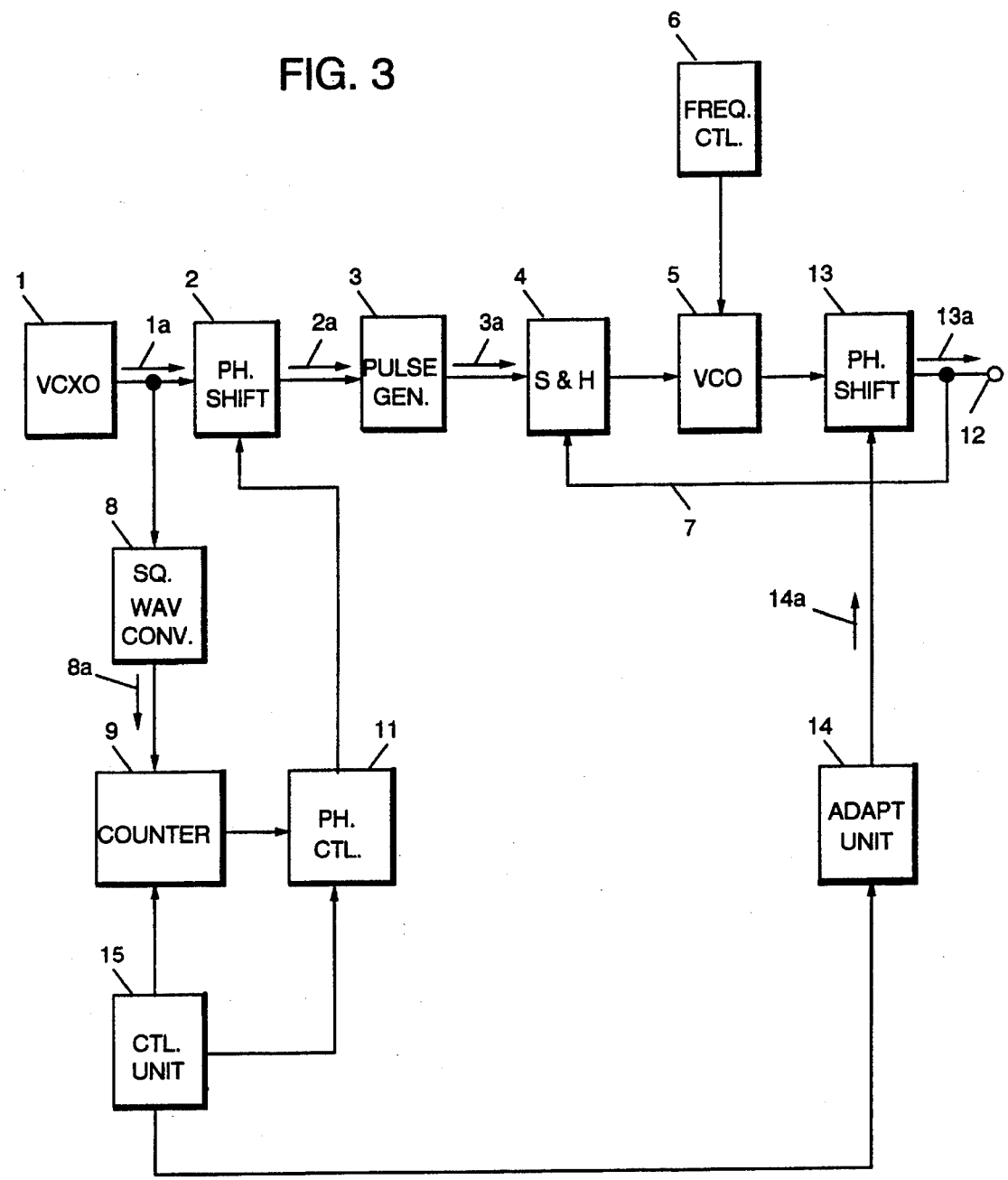
FIG. 3 shows a block diagram of an arrangement according to the invention.

The difference between the device according to FIG. 1 and that shown in FIG. 3 is that the control unit 10 has an additional function and has therefore been referenced as 15 and that a second phase shifting device (phase shifter) 13 has been introduced for phase shifting the output signal from the voltage controlled oscillator 5. The second phase shifter 13 is controlled via an adaptation unit 14 by the control unit 15.

The function of the device coincides mainly to the device described above. Therefore, mainly the divergent functioning will be described.

The control unit 15 controls the counter 9 as before and thus determines the number to which the counter should count. Additionally, the control unit can inhibit the counter. One or more negative edges of the signal 8a from the square wave generator 8 will therefore be skipped during the counting. This results in a time shift of the counting cycle of the counter 9. The control signal from a digital-analogue converter 11 to the first phase shifter 2 is time shifted to a corresponding degree, which means that any change of the phase shift of the reference signal has not happened during the time that the counter 9 has been inhibited. When the counter 9 starts again, the phase between both input signals to the sample-and-hold circuit 4 will be such that a relatively large error signal is obtained and a correction of the voltage controlled oscillator is started. Depending on the bandwidth of the low pass filter that comprised in the phase locked loop (not shown), the transient decay of the amplitude of the error signal is a function of new correction times until the voltage controlled oscillator 5 reaches a new constant phase relative the old phase. The difference between the new and the old phase is determined by how many pulses that are inhibited in the counter 9 and to which partial multiple of the reference signal that the voltage controlled oscillator is phase locked. If, for example, the partial multiple is ¼, then each inhibit of the counter will correspond to a phase shift of 360°/4=90°.

In order to reduce the transient decay time of the relatively large error signal that is formed when a new phase is to be activated, the second phase shifter 13 can however be used. Via the interface unit 14 that may, for example, be a digital-analogue converter, the control unit 15 can thus control the second phase shifter to a value (Φ) that corresponds primarily to the desired phase shift. In this manner, the new phase is compensated for so that the earlier relatively large error signal instead becomes relatively small, with the consequence that the settling time to the new phase of the voltage controlled oscillator decreases. The phase locked loop will thus only have to correct for minor, unforeseen deviations.

Figure 4:
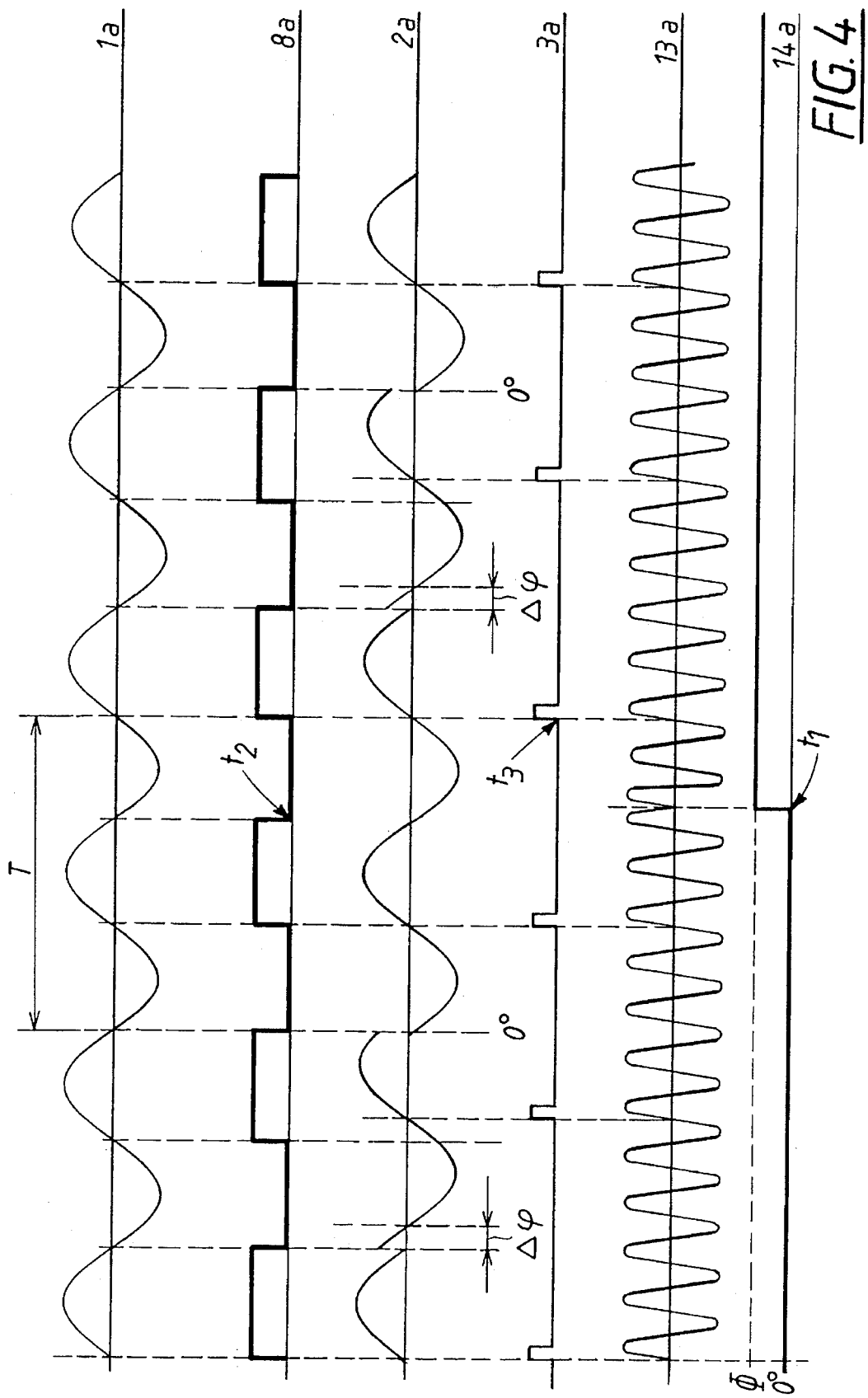
FIG. 4 shows appearances of certain signals in the arrangement according to the invention in a time diagram.

FIG. 4 shows the principal appearance of certain signals in an example where the second phase shifter 13 is used. Also in this case, it is assumed that the highest value that the counter 9 can reach is chosen so that the counter can only assume two different values. The four uppermost signals in the diagram (1a, 8a, 2a, and 3a) correspond to the output signals from the reference oscillator 1, the signal converting means 8, the first phase shifter 2, and the pulse generating device 3, respectively. It should be mentioned that the phase shift Δφ at the signal 2a influences the frequency attained from the device.

The signal 13a represents the signal obtained from the second phase shifter, land the signal 14a represents the control signal to the Second phase shifter. The control signal changes its value from 0° to Φ° at the time $t_1$.

During the time interval T, the counter 9 is assumed to be inhibited, which in this example means that a negative edge of the square wave signal (at the time $t_2$) will not be counted. This in turn means that the first phase shifter 2 is not going to change its phase shift at the time $t_2$. The following pulse from the pulse generating device 3 will therefore turn up at the "wrong" time, which should result in an error signal from the sample-and-hold circuit 4. Though as has been described above, however, this is avoided because the control unit 15 changes the phase shift of the second phase shifter at the time $t_1$ (see the signal 14a in FIG. 4) to Φ. Φ is adapted so that the output signal from the voltage controlled oscillator 5 after the phase shift obtains a phase which means that the error signal at the sampling at time $t_3$ still mainly is 0.

In the example in FIG. 4 where a negative pulse edge is omitted during the inhibit of the counter and where the frequency of the VCO is locked to 4.5 times the reference frequency, the output Signal of the VCO, and therefore of the whole oscillator device, is phase shifted 180° relative the earlier phase position.

By inhibiting the counter 9 for a suitable length of time, a clearly defined phase shift of the signal of the oscillator can consequently be obtained. The number of possible phase positions is determined by the partial multiple, and the desired phase can be chosen at will between them. A frequency generator according to the described embodiment can in principle provide an arbitrary number of very well defined phase positions of the generated signal and it also becomes relatively simple and cheap.

The invention is not restricted to the above described embodiments, but can be varied within the scope of the appended claims.

What is claimed is:

1. A method for changing a phase of a generated signal by a predetermined value in a device for frequency generation in which the generated signal is phase locked to a reference signal, whereby the generated signal, whose frequency can be a non-integer multiple of a frequency of the reference signal, is phase locked to the reference signal by changing a phase of the reference signal every period by a value that determines the frequency of the generated signal, wherein the changing of the phase of the generated signal is performed by not changing the phase of the reference signal during at least one period of the reference signal.

2. The method of claim 1, wherein in connection with not changing the phase of the reference signal, the phase of the generated signal is changed before it is phase locked to the reference signal.

3. The method of claim 1, wherein the phase of the generated signal is changed by a value that substantially corresponds to the predetermined value.

4. A device for changing a phase of a generated signal by a predetermined value in a device for frequency generation in which the generated signal is phase locked to a reference signal, whereby the generated signal, whose frequency can be a non-integer multiple of a frequency of the reference signal, is phase locked to the reference signal, comprising:

first means for changing a phase of the reference signal every period by a value that determines the frequency of the generated signal; and means for controlling the first means in such a way that at least one change of the phase shift of the reference signal is not performed during at least one period of the reference signal.

5. The device of claim 4, further comprising a second phase shifting device, wherein in connection with not performing the change of the phase of the reference signal, the phase of the generated signal is changed by the second phase shifting device before it is phase locked to the reference signal.

6. The device of claim 5, wherein with the phase shift in the second phase shifting device, the phase shift of the generated signal is changed by a value that substantially corresponds to the predetermined value.

7. The device of claim 4, wherein the change of the phase shift in the first phase shifting device is performed synchronously with the frequency of the reference signal.

* * * * *